United States Patent [19]
Ramet et al.

[11] Patent Number: 5,933,046
[45] Date of Patent: Aug. 3, 1999

[54] LOW-VOLTAGE ANALOG SWITCH HAVING SELECTIVE BULK BIASING CIRCUITRY

[75] Inventors: Serge Ramet, Grenoble; François Van Zanten, Meylan, both of France

[73] Assignee: STMicroelectronics, S.A., Gentilly, France

[21] Appl. No.: 08/707,464

[22] Filed: Sep. 4, 1996

[30] Foreign Application Priority Data

Sep. 5, 1995 [FR] France ................................. 95 10572

[51] Int. Cl.⁶ .................................................. H03K 3/01
[52] U.S. Cl. .......................... 327/534; 327/537; 327/541
[58] Field of Search .................... 327/534, 535, 327/537, 63, 65, 541; 257/335, 392, 368

[56] References Cited

U.S. PATENT DOCUMENTS

| | | | |
|---|---|---|---|
| 4,256,979 | 3/1981 | Hendrickson et al. | 327/409 |
| 4,529,897 | 7/1985 | Suzuki et al. | 327/437 |
| 4,994,886 | 2/1991 | Nadd | 257/368 |
| 5,142,244 | 8/1992 | Glica et al. | 327/65 |
| 5,442,307 | 8/1995 | Shigehara et al. | 327/537 |

OTHER PUBLICATIONS

Denton, et al., "The Long Term Reliability of a Switched–Capacitor Relative Humidity Sensor System," In *Proceedings of the 33rd Midwest Symposium on Circuits and Systems*, Calgary, Canada, Aug. 12–15, 1990, pp. 854–857.

*Primary Examiner*—Kenneth B. Wells
*Attorney, Agent, or Firm*—David V. Carlson; Seed and Berry LLP

[57] ABSTRACT

An analog switch formed from a MOS transistor switch includes means for applying to the bulk terminal of the transistor switch the voltage of either one of the two main terminals of the transistor switch as a function of the relation between the voltages of said main terminals.

22 Claims, 2 Drawing Sheets

LOW-VOLTAGE ANALOG SWITCH HAVING SELECTIVE BULK BIASING CIRCUITRY

BACKGROUND OF THE INVENTION

1. Field of the Invention

The present invention relates to analog switches fabricated from a MOS transistor, and more particularly to switches incorporated in circuits operating at a low voltage, for example 3 volts.

2. Discussion of the Related Art

FIG. 1 represents a P-channel MOS transistor usable as an analog switch. The transistor includes a control terminal or gate Vg, a bulk terminal Vb, and two main terminals U1 and U2 (usually called source and drain) which form the switch terminals. The bulk terminal Vb generally corresponds to a substrate terminal for N-channel MOS transistors and to a well terminal for P-channel MOS transistors.

To simplify the drawings and the description, the same reference characters designate a terminal and the terminal voltage.

The two main terminals U1 and U2 of a MOS transistor are symmetrical. The role of each terminal (source or drain) depends upon its voltage. Thus, for a P-channel MOS transistor (FIG. 1), the source is the terminal U1 or U2 having the highest voltage while, for an N-channel MOS transistor, the source is the terminal U1 or U2 having the lowest voltage. A MOS transistor switch is designed to switch a signal present at either of terminals U1 or U2 toward the other terminal. Thus, it cannot be determined beforehand which terminal is the source or the drain.

The impossibility of being able to determine the role of terminals U1 and U2 is a drawback when the MOS transistor is used as a switch in a circuit supplied by a low voltage, for example 3 volts. In fact, for a MOS transistor to suitably operate as a switch, i.e., to behave like a low resistor in the on state, a voltage which sufficiently exceeds the transistor threshold voltage should be applied across its gate and source. It is therefore obvious that it is desirable to reduce the threshold voltage. In practice, because of the so-called bulk effect, the threshold voltage of the MOS transistor increases with the voltage present between the source (U1 or U2) and the bulk terminal Vb. In addition, the threshold voltage varies as a function of temperature.

In order to have a minimum threshold voltage, the ideal solution is to connect the bulk terminal Vb to the transistor source. However, as mentioned above, it cannot be determined which one of the main terminals U1 or U2 of the switch is the source. Thus, the bulk terminal Vb should be connected to a fixed voltage which should be higher than the source voltage for a P-channel MOS transistor, or lower than the source voltage for an N-channel MOS transistor, to prevent forward biasing of a diode present between the bulk terminal Vb and the main terminal U1 or U2.

For a P-channel MOS transistor (FIG. 1), the bulk voltage Vb is generally connected to a high supply voltage Vcc of the circuit and a low supply voltage GND is applied to the gate Vg to turn on the switch. When voltages U1 and U2 approach zero (voltage GND), the voltage between the source (terminal U1 or U2) and the gate (at voltage GND), liable to render the switch conductive, decreases. Moreover, the threshold voltage reaches its maximum value when voltages U1 and U2 are close to zero. As a result, the switch cannot operate within a relatively high range extending from the low voltage GND. This range is close to 3 volts in current techniques, which makes it impossible to use such a switch in a circuit supplied at 3 volts, unless specific measures, described hereinafter, are taken.

The problem is the same for an N-channel MOS transistor switch, the non-operating range being close to the high supply voltage Vcc.

To solve this problem, a conventional approach consists of providing charge-pump circuits which increase the gate voltage Vg of the transistor switch to values beyond the supply voltages. However, the charge pump circuits operate at high frequencies and may introduce spurious pulses in the analog signals which are to be connected. In addition, the relatively complex charge-pump circuits occupy a non-negligible surface.

SUMMARY OF THE INVENTION

An object of the present invention is to provide a MOS transistor analog switch adapted to operate in a circuit supplied at a low-voltage without the need for an extra supply source to control the transistor gate.

To achieve this object, the present invention provides an analog switch formed from a MOS transistor, which includes means for applying to the bulk terminal of the transistor the voltage of either one of the two main terminals of the transistor as a function of the relation between the voltages of the main terminals.

According to one embodiment of the invention, the voltage applied to the bulk terminal is the higher of the voltages of the two main terminals, when the transistor switch is of the P-channel type.

According to another embodiment of the invention, the voltage applied to the substrate terminal is the lower of the voltages of the two main terminals, when the transistor switch is of the N-channel type.

According to another embodiment of the invention, the switch includes two transistors connected as a differential stage and respectively controlled by the two main terminals of the transistor switch, a common branch of the differential stage being connected to the bulk terminal through a diode.

According to another embodiment of the invention, the diode is formed by a transistor of a type complementary to the types of the differential stage, the main terminals of the transistor being respectively connected to the bulk terminal and to a first supply voltage, and its control terminal being connected to the common branch of the differential stage.

According to another embodiment of the invention, the switch includes two transistors connected as a differential stage and respectively controlled by two transistors following the voltages of the main terminals of the transistor switch, a common branch of the differential stage being connected to the bulk terminal of the transistor switch.

According to another embodiment of the invention, each follower transistor is biased by a second MOS transistor connected through a common resistive element to a second supply voltage. The second MOS transistor receives at its gate a fixed voltage also provided to the gate of a third MOS transistor connected between the resistive element and the bulk terminal of the transistor switch.

The foregoing and other objects, features, aspects and advantages of the invention will become apparent from the following detailed description of the present invention when taken in conjunction with the accompanying drawings.

Preferably, according to the invention, a P-channel MOS transistor is used as an analog switch, the bulk terminal Vb of which can be selectively connected, whereas the substrate terminal of an N-channel MOS transistor is, in most techniques, necessarily connected to the low supply voltage of the circuit. Of course, the present invention also applies to N-channel MOS transistors when it is possible to selectively connect the substrate terminal of the transistor.

It is important that the bulk terminal of the MOS transistor be available, because, according to the invention, the terminal is set to the higher of the two voltages of the main terminals U1 and U2 of the transistor.

Figure 1:
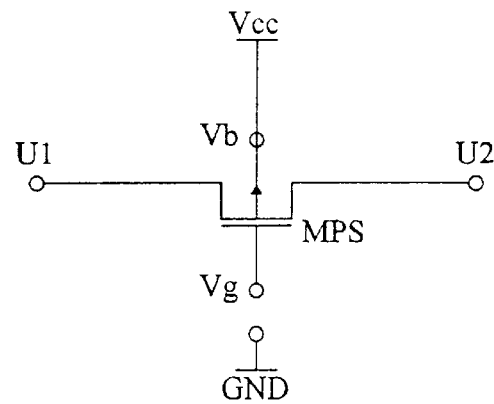
FIG. 1, above described, represents a conventional P-channel MOS transistor switch.
Figure 2A:
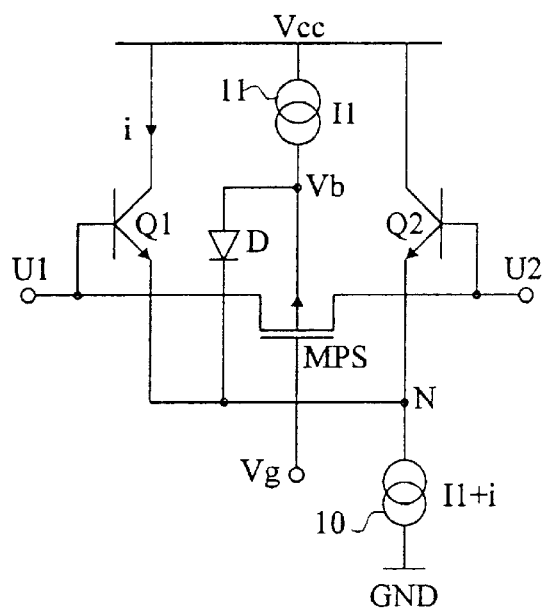
FIGS. 2A and 2B represent a first embodiment of an analog switch according to the present invention, of the BICMOS and CMOS types, respectively.

In FIG. 2A, the main terminals U1 and U2 of a P-channel MOS switching transistor MPS are respectively connected to the bases of two NPN bipolar transistors Q1 and Q2 that are connected as a differential stage. In this embodiment, the two bipolar transistors Q1 and Q2 comprise a voltage control circuit that applies at the bulk terminal Vb the higher of the two voltages of terminals U1 and U2. The collectors of transistors Q1 and Q2 are connected to a high supply voltage Vcc. The emitters of transistors Q1 and Q2 are connected to a common node N, in turn connected to a low supply voltage GND through a current source 10. The bulk terminal Vb of the switching transistor MPS is connected to voltage Vcc through a current source 11 and to node N through a diode D. Diode D is connected in a direction enabling current 11 of source 11 to flow toward source 10.

With this configuration, node N is set to the higher of the two voltages U1 or U2, decreased by the base-emitter voltage Vbe of transistors Q1 and Q2. For example, if voltage U1 is higher than voltage U2, transistor Q1 behaves like a transistor-emitter-follower; so, transistor Q2 is blocked because its base-emitter junction is reverse biased. The bulk voltage Vb of transistor MPS is set to the voltage of node N, increased by the threshold voltage of diode D, substantially equal to a voltage Vbe. Thus, voltage Vb is substantially equal to the higher of voltages U1 and U2.

Current source 10 supplies a current higher than that of source 1, so that a current i biases the transistor Q1 or Q2 which is conductive.

The switch of FIG. 2A should be fabricated in BICMOS technique, which can involve an additional cost if all the other components of the circuit can be fabricated in CMOS technique.

Figure 2B:
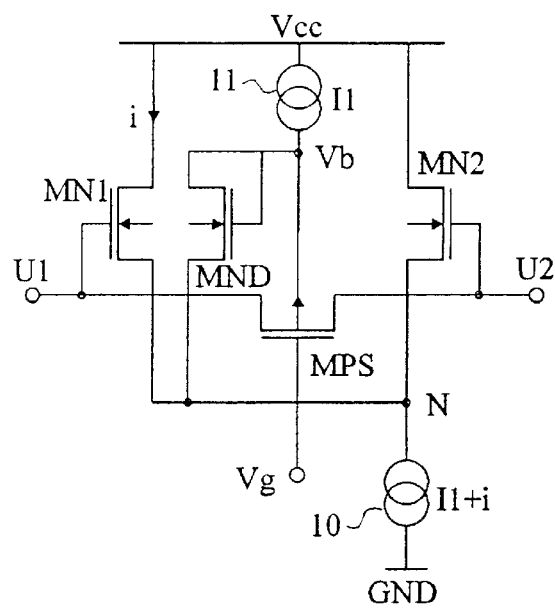

FIG. 2B represents the switch of FIG. 2A fabricated in CMOS technique. For this purpose, it is sufficient to replace the NPN transistors Q1 and Q2 of FIG. 2A with N-channel MOS transistors MN1 and MN2. Diode D of FIG. 2A is replaced with an N-channel MOS transistor MND having its gate and drain connected to voltage Vb and its source connected to node N. The bulk terminals of the N-channel transistors, represented as floating in FIG. 2B, are generally connected to voltage GND.

The switch of FIG. 2B operates like the switch of FIG. 2A, except that the voltage of node N differs from the higher voltage U1 or U2 by a threshold voltage Vt of transistors MN1 and MN2, and not by an emitter-base voltage Vbe.

In the above described switches, the bulk voltage Vb of the transistor switch MPS is set to the higher voltage of its main terminals U1 and U2. This amounts to achieving a direct connection between the bulk terminal Vb and the source terminal MPS, which corresponds to the optimal configuration for a switch MOS transistor, because its threshold voltage is then minimized. Such a switch is usable in circuits operating at voltages as low as 3 volts or lower.

In the switches of FIGS. 2A and 2B, when voltages U1 and U2 become lower than the threshold voltage of the transistors of the differential stage (Q1 and Q2 or MN1 and MN2), increased by a dropout voltage across source 10, the differential stage can no longer operate. As a consequence, the bulk voltage Vb of the transistor switch MPS is blocked at a minimum value equal to the threshold voltage of diode D or MND, increased by the dropout voltage across source 10. Thus, the threshold voltage of the transistor switch MPS increases when voltages U1 and U2 decrease below the minimum value of voltage Vb, while slightly limiting the operating range of the switch.

Figure 3:
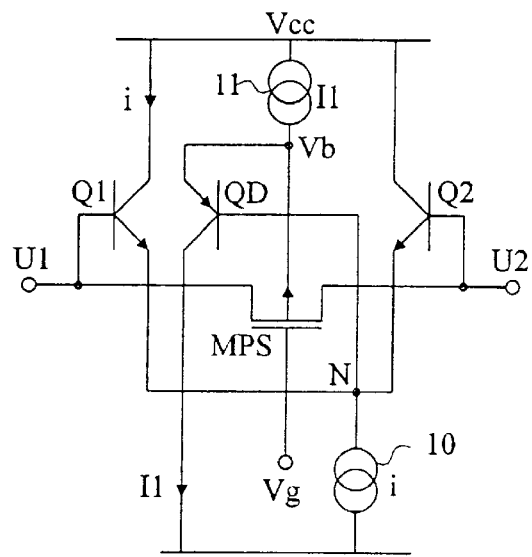
FIG. 3 represents an alternative embodiment of the switch of FIG. 2A.

FIG. 3 represents an alternative of the switch of FIG. 2A. Diode D is replaced with a PNP transistor QD having a base connected to node N, an emitter connected to the bulk terminal Vb and a collector connected to the low supply voltage GND. Under normal operation, transistor QD behaves like a transistor follower of voltage of node N, which performs the same function as diode D in FIG. 2A.

When voltages U1 and U2 are so low that transistors Q1 and Q2 are both blocked, the current of source 10 no longer flows through one of transistors Q1 and Q2 but through the base-emitter junction of transistor QD. Thus, transistor QD behaves like a diode connected in the forward direction between the bulk terminal Vb and voltage GND. Then, a minimum voltage Vb equal to voltage Vbe is obtained.

In a further alternative embodiment, the circuit of FIG. 3 is directly fabricated in CMOS technique, by replacing the bipolar transistors with MOS transistors of the corresponding type. Thus, similar to the change made from FIG. 2A to FIG. 2B, transistors Q1 and Q2 are replaced with N-channel MOS transistors, and transistor QD is replaced with a P-channel MOS transistor.

Of course, if voltages U1 and U2 approach very close to the low voltage GND, the higher of voltages U1 and U2 becomes lower than the threshold voltage of the transistor switch MPS, independently of how low the level of this threshold voltage is, whereby transistor MPS can no longer be turned on. In this case, a conventional approach consists of connecting in parallel with the P-channel transistor MPS an N-channel MOS transistor switch (not shown) whose gate is controlled in phase opposition with respect to gate Vg of transistor MPS, so that both transistors become conductive at the same time.

It is generally unnecessary to provide the circuit according to the invention with an N-channel transistor switch because the latter must only operate in the case where voltages U1 and U2 are very close to voltage GND, which corresponds to a suitable operation range of the N-channel transistor switch. In fact, the bulk terminal of the N-channel transistor switch is generally connected to the low-voltage GND to which the lower of voltages U1 and U2 becomes closer, this voltage corresponding to the source of the N-channel transistor switch. Therefore, the invention may be implemented with an MPS transistor which is N-channel by switching the positions and connections of the transistors of the P-channel embodiment to be suitable for N-channel use, as will be apparent to those of skill in the art if they are given the teachings of this invention. In those cases where the threshold voltage of the MPS transistor remains particularly high, a circuit according to the invention should be provided with the N-channel transistor switch.

Figure 4:
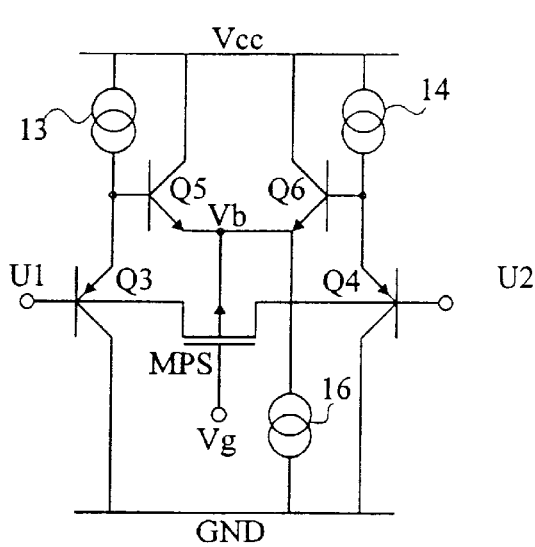
FIG. 4 represents another embodiment of an analog switch according to the present invention, of the BICMOS type.

FIG. 4 represents another embodiment of an analog switch according to the invention. The main terminals U1 and U2 of the transistor MPS are connected to the bases of two PNP transistors Q3 and Q4, respectively. The collectors of transistors Q3 and Q4 are connected to the low voltage GND and their emitters are connected to the high voltage Vcc through the respective current sources 13 and 14. The emitters of transistors Q3 and Q4 are also connected to the bases of two NPN transistors Q5 and Q6 that are connected as a differential stage, respectively. The collectors of transistors Q5 and Q6 are connected to voltage Vcc and their emitters are connected to the bulk terminal Vb of the transistor MPS and to voltage GND through a current source 16.

Transistors Q3 and Q4 are transistor-followers and respectively apply voltages U1 and U2, increased by a voltage Vbe, to the bases of transistors Q5 and Q6. Only the one of transistors Q5 or Q6 which has the highest base voltage is conductive. As a result, the bulk voltage Vb is equal to this highest base voltage, decreased by a voltage Vbe. Hence, the circuit of FIG. 4 also enables voltage Vb to be equal to the higher of voltages U1 and U2.

When voltages U1 and U2 become close to voltage Vcc, the voltages across the current sources 13 and 14 (generally MOS transistors) become insufficient to enable the sources to provide a constant current; then, they operate as resistors until the emitter voltages of transistors Q3 and Q4 reach voltage Vcc. Transistors Q3 and Q4 are blocked and the current sources 13 and 14 provide current through the base-emitter junctions of transistors Q5 and Q6. Transistors Q5 and Q6 operate as diodes and set voltage Vb to voltage Vcc decreased by the voltage Vbe of transistors Q5 and Q6. Voltages U1 and U2 can further increase up to voltage Vcc without impairing the suitable operation of the switch. Beyond voltage Vcc, the diodes present between the bulk voltage Vb and the main terminals U1 and U2 of the MPS transistor are forward biased, which should be avoided.

Figure 5:
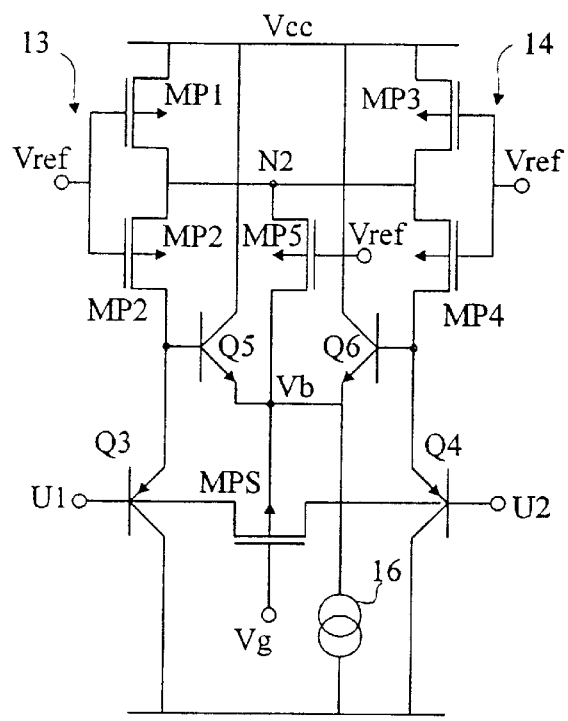
FIG. 5 represents an alternative embodiment of FIG. 4.

FIG. 5 represents a modification of the switch of FIG. 4, which prevents the diodes between the bulk and one main terminal of the transistor MPS from being biased in the forward direction. Each of the current sources 13 and 14 is fabricated from two P-channel MOS transistors connected in series by their main terminals (transistors MP1 and MP2 for current source 13, and MP3 and MP4 for current source 14). The connection node N2 between transistors MP1 and MP2 is connected to the connection node between transistors MP3 and MP4, and to the bulk terminal Vb through a P-channel MOS transistor MP5. The gates of transistors MP1 to MP5 receive a same reference voltage Vref, and their bulk terminals are connected to the transistor sources or to voltage Vcc.

The five transistors MP1–MP5 can be integrated on a very small surface, because each transistor has two common terminals (even three, if the bulk terminals are connected to voltage Vcc) with the other transistors. Of course, transistors MP1 and MP3 can be fabricated from a single transistor having a suitable size.

Transistors MP2, MP4 and MP5 behave like transistor-followers which set the voltage of node N2 to voltage Vref substantially increased by the threshold voltage of transistors MP2, MP4 and MP5. The drain-source voltage of transistors MP1 and MP3 is close to zero, whereby they behave like resistors. Thus, the voltage of node N2 determines the global current in transistors MP1 and MP3. The global current is selected higher than the current of source 16 and is distributed in transistors MP2, MP4 and MP5 in the normal operation range, i.e., when transistors Q3 and Q4 are not blocked. The switch then behaves like the switch of FIG. 4, except that transistor MP5 absorbs a fraction of the current provided by source 16 to transistors Q5 and Q6, the fraction being of course lower than the current of source 16.

When voltages U1 and U2 approach voltage Vcc, transistors Q3 and Q4 are finally blocked. As in FIG. 4, transistors Q5 and Q6 behave like diodes which set the bulk voltage Vb back to the voltage of node N2 (substantially Vcc), decreased by a voltage Vbe. At this step, transistors MP2 and MP4 are blocked and the global current of transistors MP1 and MP3 flows only through transistor MP5 which has still a sufficient operation range (approximately a voltage Vbe). This global current maintains its initial value, higher than that of source 16, since the voltage of node N2 is maintained at its initial value by the transistor-follower MP5. Thus, transistor MP5 sets back the bulk voltage Vb to the voltage of node N2, i.e., close to voltage Vcc. As a consequence, voltages U1 and U2 can exceed voltage Vcc by approximately a voltage Vbe before biasing in the forward direction the diodes between the bulk and the main terminals of transistor MPS.

In the switches of FIGS. 4 and 5, the bulk voltage Vb can decrease as low as voltage GND. In practice, all the transistors Q3–Q6 continue to operate within a normal range while voltages U1 and U2 reach voltage GND. The current source 16 behaves like a resistor when voltage Vb is sufficiently close to voltage GND.

As is apparent to those skilled in the art, various modifications can be made to the above disclosed preferred embodiments. In particular, the bulk terminal of the transistor switch can be connected in other ways to the highest voltage of the two main terminals.

Although the present invention has been described with relation to a P-channel MOS transistor switch, it also applies to an N-channel MOS transistor switch. For this purpose it is sufficient to exchange the supply voltages and the types of the transistors.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

We claim:

1. An analog switch formed in an integrated circuit, comprising:
    a MOS transistor having first and second main terminals and a bulk terminal; and
    a voltage control circuit having first and second inputs respectively connected to the first and second main terminals, and including a unidirectional current carrying device connected between the voltage control circuit and the bulk terminal, the voltage control circuit being operable to apply to the bulk terminal the voltage of one of the first and second main terminals based on the voltages of the first and second main terminals.

2. The analog switch of claim 1 wherein the MOS transistor is of P-channel type and the voltage control circuit applies to the bulk terminal the greater of the voltages of the first and second main terminals.

3. The analog switch of claim 1 wherein the MOS transistor is of N-channel type and the voltage control circuit applies to the bulk terminal the smaller of the voltages of the first and second main terminals.

4. The analog switch of claim 1 wherein the voltage control circuit includes a differential stage having a common node connected to the bulk terminal.

5. The analog switch of claim 4 wherein the unidirectional current carrying device is a transistor of complementary type to the differential stage, the transistor being connected between the bulk terminal and the common node, and configured as a diode.

6. The analog switch of claim 4 wherein the voltage control circuit further includes a transistor of complementary type to the differential stage coupled between the bulk terminal and a current source.

7. The analog switch for claim 5 wherein the common node is coupled to a ground voltage through a current source.

8. An analog switch formed in an integrated circuit comprising:
 a MOS transistor having first and second main terminals and a bulk terminal;
 a differential stage having first and second differential inputs respectively coupled to the first and second main terminals and having a common node, the differential stage structured to apply to the bulk terminal a potential that is substantially equal to the greater of the voltages of the first and second main terminals; and
 a unidirectional current-carrying device coupled between the common node and the bulk terminal.

9. The analog switch of claim 8 wherein the differential stage is part of a voltage control circuit that further includes:
 a first current source coupled between a voltage supply and the bulk terminal;
 a second current source coupled between the bulk terminal and a ground voltage; and
 wherein the unidirectional current carrying device is a diode-configured transistor.

10. The analog switch of claim 8 wherein the MOS transistor is of P-channel type.

11. The analog switch of claim 8 wherein the unidirectional current-carrying device comprises a diode.

12. An analog switch formed from a MOS transistor switch, comprising:
 two transistors connected as a differential stage and respectively controlled from two main terminals of the transistor switch, first main terminals of the two transistors being connected to a common node which is coupled to a bulk terminal of the transistor switch; and
 wherein the common node of the differential stage is connected to the bulk terminal through a diode.

13. The analog switch of claim 12 wherein the transistor switch is of P-channel type and the differential stage comprises N-channel MOS transistors or NPN bipolar transistors.

14. The analog switch of claim 12 wherein the diode is formed by a transistor of a type complementary to the types of the differential stage, whose main terminals are respectively connected to the bulk terminal and to the common node, and whose control terminal is connected to the common node of the differential stage.

15. The analog switch of claim 12 wherein the two transistors connected as a differential stage are respectively controlled by two transistors following the voltages of the main terminals of the transistor switch, the common node of the differential stage being connected to the bulk terminal of said transistor switch.

16. The analog switch of claim 15, wherein each transistor-follower is biased by a second MOS transistor connected through a common resistive means to a second supply voltage, and wherein the second MOS transistor receives at its gate a fixed voltage also provided to the gate of a third MOS transistor connected between the resistive means and the bulk terminal of the transistor switch.

17. The analog switch of claim 14 wherein the common node is additionally coupled to a first supply voltage.

18. An analog switch formed of a MOS transistor switch comprising two transistors each having a first main terminal coupled through a diode to a bulk terminal of the transistor switch, a second main terminal coupled to a supply voltage, and a control terminal connected to follow the voltage on a respective main terminal of the transistor switch.

19. The analog switch of claim 18 wherein the transistor switch is of P-channel type and the two transistors comprise N-channel MOS transistors or NPN bipolar transistors.

20. The analog switch of claim 18 wherein the diode is formed by a transistor of a type complementary to the types of the two transistors, and having main terminals respectively connected to the first main terminal and to the bulk terminal.

21. The analog switch of claim 18 wherein the two transistors are respectively controlled by two transistors following the voltages of the main terminals of the transistor switch, the common node of the differential stage being connected to the bulk terminal of said transistor switch.

22. The analog switch of claim 21 wherein each transistor-follower is biased by a second MOS transistor connected through a common resistive means to a second supply voltage, and wherein the second MOS transistor receives at its gate a fixed voltage also provided to the gate of a third MOS transistor connected between the resistive means and the bulk terminal of the transistor switch.

* * * * *